(12) United States Patent
Kraft et al.

(10) Patent No.: US 8,969,193 B2
(45) Date of Patent: Mar. 3, 2015

(54) METHOD OF PRODUCING A SEMICONDUCTOR DEVICE HAVING AN INTERCONNECT THROUGH THE SUBSTRATE

(71) Applicant: ams AG, Unterpremstätten (AT)

(72) Inventors: Jochen Kraft, Oberaich (AT); Franz Schrank, Graz (AT); Martin Schrems, Eggersdorf (AT)

(73) Assignee: ams AG, Unterpremstaetten (AT)

( * ) Notice: Subject to any disclaimer, the term of this patent is extended or adjusted under 35 U.S.C. 154(b) by 0 days.

(21) Appl. No.: 13/956,274

(22) Filed: Jul. 31, 2013

(65) Prior Publication Data
US 2014/0038410 A1 Feb. 6, 2014

(30) Foreign Application Priority Data

Aug. 1, 2012 (EP) .................................... 12178878

(51) Int. Cl.
*H01L 21/4763* (2006.01)
*H01L 21/768* (2006.01)
*H01L 23/48* (2006.01)

(52) U.S. Cl.
CPC ........ *H01L 21/76898* (2013.01); *H01L 23/481* (2013.01); *H01L 2924/0002* (2013.01)
USPC ............ 438/637; 438/620; 438/672; 438/673

(58) Field of Classification Search
CPC .................. H01L 23/481; H01L 24/05; H01L 2924/1517
See application file for complete search history.

(56) References Cited

U.S. PATENT DOCUMENTS

| 7,704,874 B1* | 4/2010 | Kar-Roy et al. ............... 438/637 |
| 2010/0123254 A1 | 5/2010 | Kraft et al. |
| 2011/0260284 A1 | 10/2011 | Schrank et al. |
| 2013/0221539 A1* | 8/2013 | Kraft et al. .................... 257/774 |

FOREIGN PATENT DOCUMENTS

| DE | 102008033395 B3 | 2/2010 |
| EP | 1564807 A2 | 8/2005 |
| EP | 2306506 A1 | 4/2011 |

* cited by examiner

*Primary Examiner* — Brett Feeney
*Assistant Examiner* — Pamela E Perkins
(74) *Attorney, Agent, or Firm* — McDermott Will & Emery LLP

(57) ABSTRACT

A semiconductor substrate (1) is provided on a main surface (14) with an intermetal dielectric (4) including metal planes (5) and on an opposite rear surface (15) with an insulation layer (2) and an electrically conductive connection pad (7). An etch stop layer (6) is applied on the intermetal dielectric to prevent a removal of the intermetal dielectric above the metal planes during subsequent method steps. An opening (9) having a side wall (3) and a bottom (13) is formed from the main surface through the substrate above the connection pad. A side wall spacer (10) is formed on the side wall by a production and subsequent partial removal of a dielectric layer (11). The insulation layer is removed from the bottom to uncover an area of the connection pad. A metal layer is applied in the opening and is provided for an interconnect through the substrate.

11 Claims, 4 Drawing Sheets

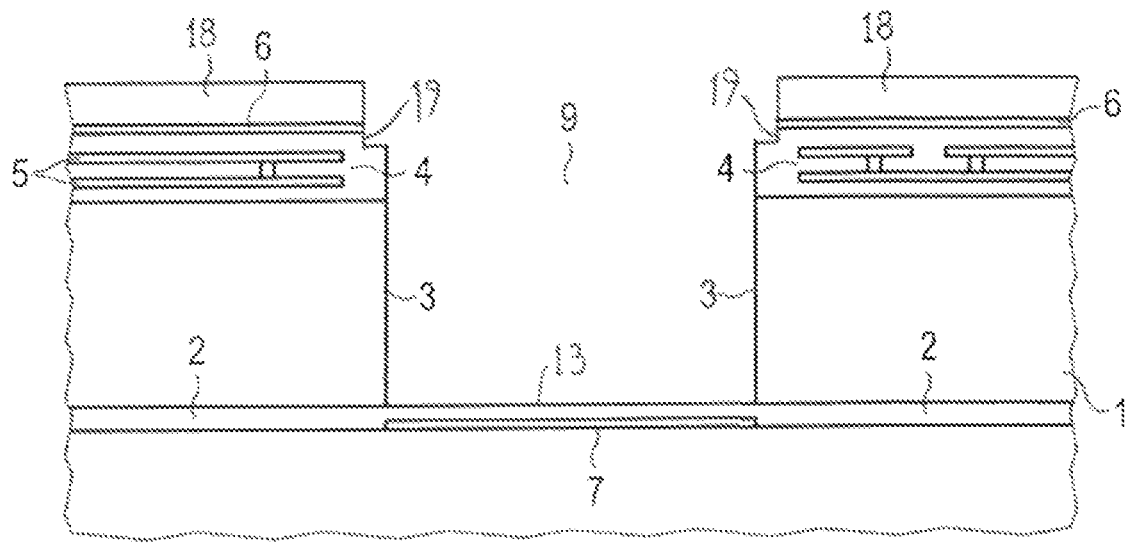
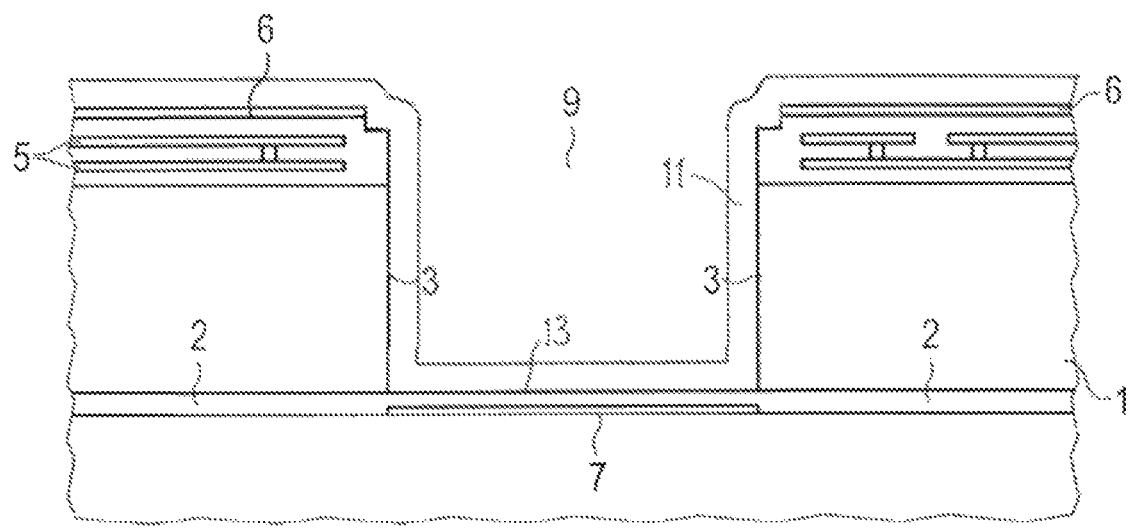

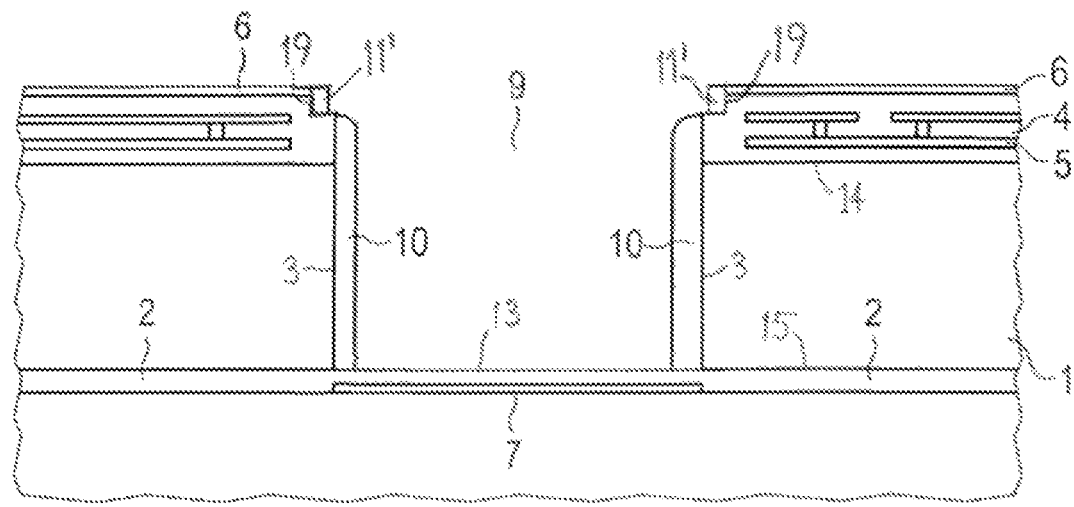
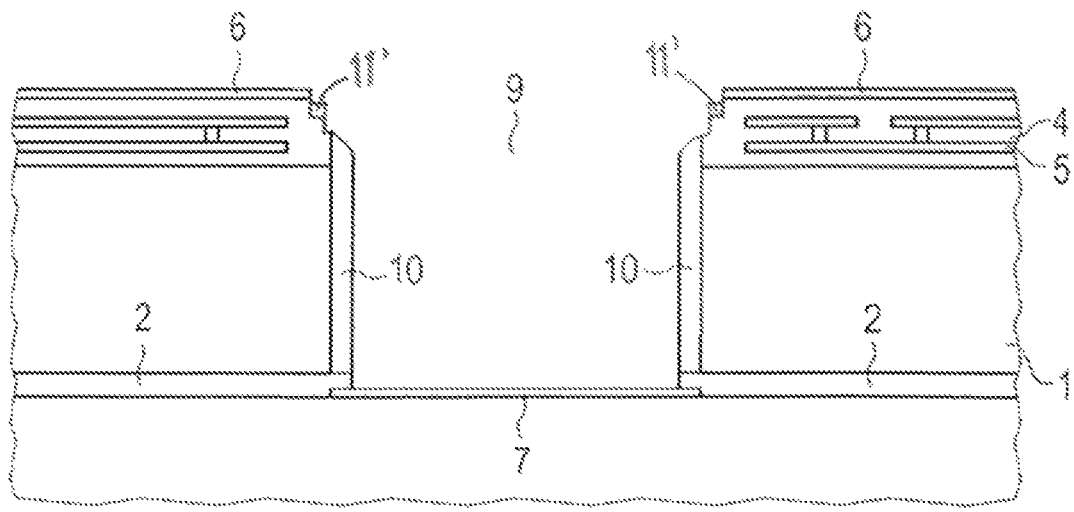

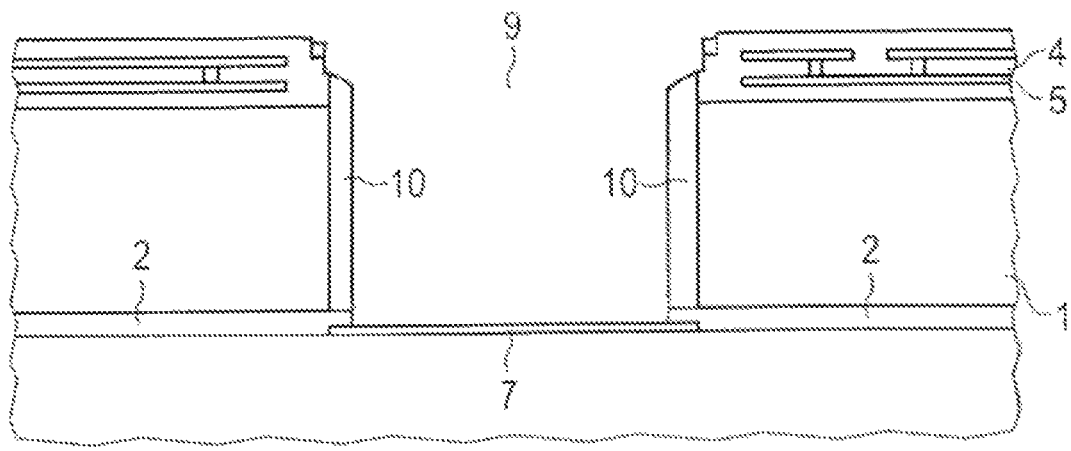
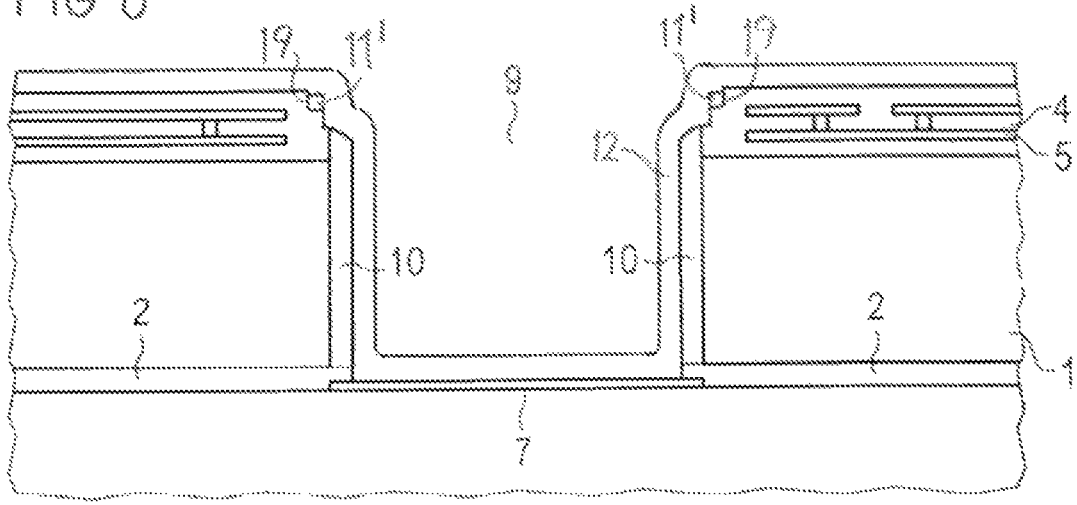

METHOD OF PRODUCING A SEMICONDUCTOR DEVICE HAVING AN INTERCONNECT THROUGH THE SUBSTRATE

BACKGROUND OF THE INVENTION

1. Field of the Invention

The invention relates to the manufacturing of a semiconductor device having an interconnect like a through-wafer via or through-silicon via.

2. Background Art

DE 10 2008 033 395 A1 describes a method for the manufacture of a semiconductor component, in which a semiconductor substrate is provided with a buried insulation layer and a connection pad is arranged in the insulation layer. An opening is created reaching from a top side of the substrate down to the insulation layer above the connection pad. A dielectric layer is deposited, and the dielectric layer and the insulation layer are removed within the opening, so that a dielectric side wall spacer is formed and the connection pad is uncovered. A metallization is deposited in electrical contact with the connection pad and forms an electrical interconnect through the substrate.

In semiconductor technology an etch stop layer is used to define the end of an etching step. The material of the etch stop layer is preferably selected to be essentially unaffected by the attack of the etchant, or at least the etching rate of the etch stop layer is substantially smaller than the etching rate of the material that is to be removed. An etch stop layer may thus provide at least a partial protection against the attack of an etchant. An etch stop layer may also be used to find a desired end point of an etching process by detecting a change of the chemical composition of the atmosphere within the etch apparatus or reactor. The change is caused by different volatile etch products generated by the chemical reactions of the etchant with the material that is to be etched and with the material of the etch stop layer, respectively. Furthermore it is known in the art that a semiconductor oxide can be removed selectively with respect to a layer formed from a semiconductor nitride, a metal or a polyimide.

SUMMARY OF THE INVENTION

The invention provides an improved method of producing a semiconductor device having an interconnect through the semiconductor substrate.

The method uses a manufacturing process that is based on a method described in the above reference and aims at preventing a reduction of the thickness of the intermetal dielectric on top of the substrate during etching steps that are used to form the interconnect. The method comprises the steps of providing a semiconductor substrate having a main surface and a rear surface opposite the main surface, providing the main surface with an intermetal dielectric and with metal planes embedded in the intermetal dielectric, and providing the rear surface with an insulation layer and an electrically conductive connection pad arranged in the insulation layer. An opening having a side wall and a bottom is formed from the main surface through the substrate above the connection pad. A side wall spacer is formed on the side wall by a production and subsequent partial removal of a dielectric layer and the insulation layer is removed from the bottom, or vice versa, an area of the connection pad being thus uncovered. A metal layer, which is provided for an interconnect through the substrate, is applied in the opening. An etch stop layer is applied on the intermetal dielectric before the dielectric layer is produced, the etch stop layer being provided to prevent a removal of the intermetal dielectric above the metal planes during the formation of the side wall spacer and during the removal of the insulation layer from the bottom of the opening. The etch stop layer is preferably applied on the intermetal dielectric before the opening is formed.

In a variant of the method, a step is formed in the intermetal dielectric when the opening is formed. A small spacer formed from the dielectric layer can be left on the step.

In a further variant of the method, the metal layer is etched back to remove it from the upper surface, thereby leaving a remaining portion of the metal layer on the step.

A further variant of the method further comprises applying a mask to the upper surface of the etch stop layer before the opening is formed, removing the intermetal dielectric in a region above the connection pad using the mask, substituting the mask with a further mask, and removing the semiconductor material of the substrate in the region above the connection pad using the further mask. A narrow step is formed in the intermetal dielectric if the mask has a slightly larger opening than the further mask.

The side wall spacer may especially be formed by an anisotropic etching process applied to the dielectric layer.

The intermetal dielectric and the insulation layer may be an oxide of the semiconductor material.

In a further variant of the method the etch stop layer is a nitride of the semiconductor material, which may be appropriate in particular if the intermetal dielectric and the insulation layer are an oxide of the semiconductor material.

In further variants of the method the etch stop layer is a metal, a polyimide or polysilicon.

In a further variant of the method the etch stop layer is removed before the metal layer is applied.

The following is a detailed description of examples of the method in conjunction with the accompanying drawings.

BRIEF DESCRIPTION OF THE DRAWINGS

FIG. 3 shows a cross section according to FIG. 2 after an opening has been formed in the substrate.

FIG. 4 shows a cross section according to FIG. 3 after the production of a dielectric layer in the opening.

FIG. 5 shows a cross section according to FIG. 4 after the formation of a side wall spacer in the opening.

FIG. 6 shows a cross section according to FIG. 5 after the exposition of the connection pad on the bottom of the opening.

FIG. 7 shows a cross section according to FIG. 6 after the removal of the etch stop layer.

FIG. 8 shows a cross section according to FIG. 7 after the deposition of a metal layer in the opening.

DETAILED DESCRIPTION OF THE INVENTION

Figure 1:
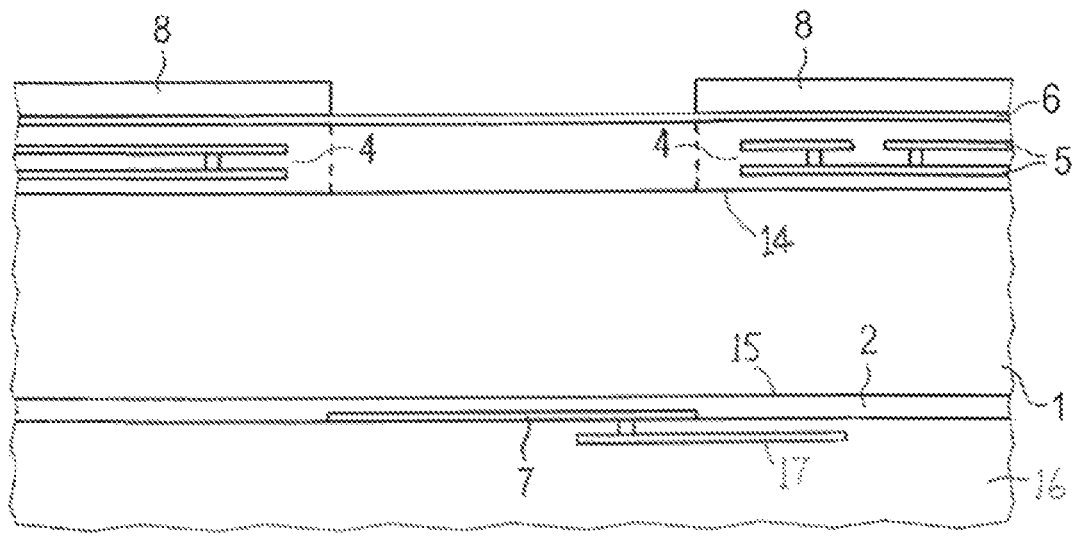
FIG. 1 shows a cross section of an example of an intermediate product before an opening is formed in the intermetal dielectric.

FIG. 1 shows a cross section of an example of an intermediate product that may be produced in the course of an application of the method. A semiconductor substrate 1, which may be silicon, for instance, is provided with an intermetal dielectric 4 on a main surface 14. Metal planes 5 are arranged within the intermetal dielectric 4 and may be provided as a wiring of a circuit that may be integrated in the substrate 1, for example. An insulation layer 2, which may be an oxide of the semiconductor material, for instance, is arranged at an opposite rear surface 15 of the substrate 1. A connection pad 7 of an electrically conductive material, in particular a metal, is also arranged at the rear surface 15 and is embedded in the insulation layer 2. The connection pad 7 may be applied to the substrate 1. Instead the connection pad 7 may be formed in a metal plane that is arranged on the top of a further substrate 16, which may be bonded to the substrate 1 by means of the insulation layer 2. The further substrate 16 may comprise further metal planes 17, which may be provided as a wiring of the further substrate 16 and may be electrically connected with the connection pad 7. The details of the electrical connections are not relevant to the method.

An etch stop layer 6 is applied to the upper surface of the intermetal dielectric 4, which is remote from the substrate 1. The etch stop layer 6 is preferably applied as a whole layer. It may be a metal layer, for instance, a layer of polyimide or a nitride of the semiconductor material, especially a silicon nitride ($Si_3N_4$, for example), which is in particular suitable if the intermetal dielectric 4 is a silicon oxide ($SiO_2$, for example). An etch stop layer of polysilicon is also suitable, in particular if the semiconductor material is silicon. Other materials of the etch stop layer 6 may be suitable as well and may be selected according to the material that is to be protected. A mask 8, which may be a resist, for instance, is applied to the upper surface of the etch stop layer 6 and is subsequently used to remove the intermetal dielectric 4 in the region above the connection pad 7. In this region, indicated with broken lines in FIG. 1, preferably no metal planes 5 are present, so that only the intermetal dielectric 4 has to be removed.

Figure 2:
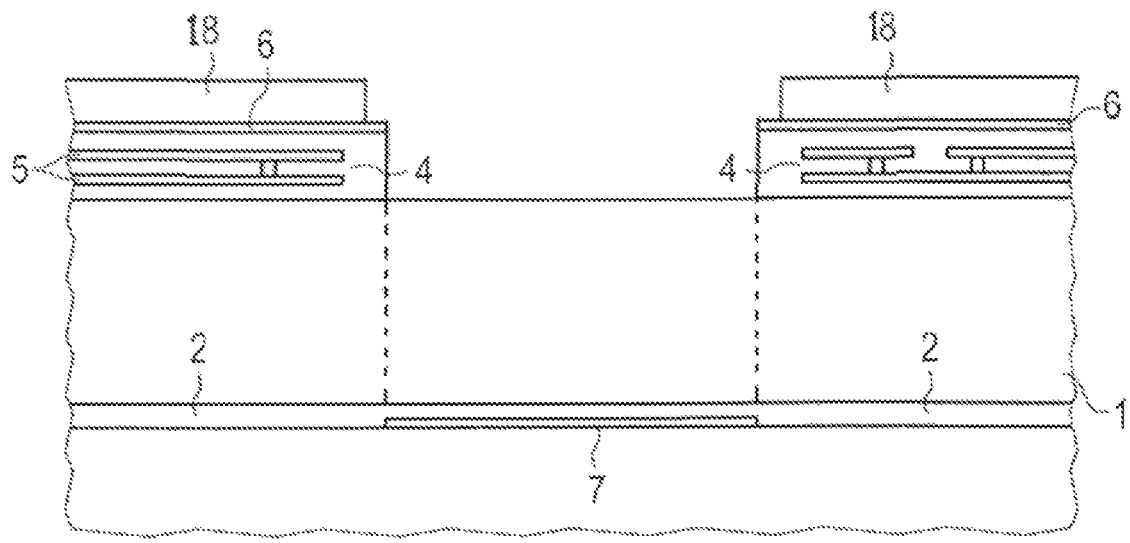
FIG. 2 shows a cross section according to FIG. 1 after an opening has been formed in the intermetal dielectric and before an opening is formed in the substrate.

FIG. 2 shows a cross section according to FIG. 1 after the removal of the intermetal dielectric 4 in the region above the connection pad 7. The corresponding elements of FIGS. 1 and 2 are designated with the same reference numerals. The mask 8 can be used again or may be substituted with a further mask 18, which may be a further resist mask or a hardmask, for example. The semiconductor material of the substrate 1 is removed in the region above the connection pad 7, as indicated with broken lines in FIG. 2. The semiconductor material is preferably anisotropically etched to form an opening 9 with an essentially perpendicular side wall 3, as shown in FIG. 3.

FIG. 3 shows a cross section according to FIG. 2 after the formation of the opening 9 in the substrate 1. The semiconductor material is etched until the insulation layer 2 is reached. Owing to the relatively long duration of the etching process, the etch attack also affects the uncovered areas of the etch stop layer 6. Consequently a step 19 is formed in the intermetal dielectric 4 at the upper edge that surrounds the opening 9, if the window of the mask 18 is slightly larger than the window of the mask 8 that had been used before. The use of the etch stop layer 6 results in the formation of a relatively sharp upper edge of the intermetal dielectric 4 around the opening 9 and of a relatively steep flank of the intermetal dielectric 4 at the step 19 adjacent to the upper edge. When no etch stop layer is present, the etching of the intermetal dielectric 4 produces a markedly rounded shape of the upper edge, and the adjacent side wall is typically more inclined.

FIG. 4 shows a cross section according to FIG. 3 after the production of a dielectric layer 11 in the opening 9. The dielectric layer 11 may be an oxide, for example, and may be deposited as a whole layer covering the upper surface of the etch stop layer 6 as well as the side wall 3 and the bottom 13 of the opening 9.

FIG. 5 shows a cross section according to FIG. 4 after the formation of a side wall spacer 10 in the opening 9. This can be achieved by an anisotropic etching of the dielectric layer 11 in the way of a spacer etching, which is per se a well-known technique in semiconductor technology. Apart from the side wall spacer 10, a portion of the dielectric layer 11 may also be left as a small spacer 11' on the step 19 of the intermetal dielectric 4, while the dielectric layer 11 is preferably completely removed from the surface of the etch stop layer 6 and from the bottom 13 of the opening 9. In this variant of the method the insulating layer 2 has still to be removed from the contact area of the connection pad 7. If the insulation layer 2 comprises the same material as the dielectric layer 11, an oxide for example, the etching of the dielectric layer 11 can be continued until the connection pad 7 is exposed.

FIG. 6 shows a cross section according to FIG. 5 after the exposition of the connection pad 7 on the bottom 13 of the opening 9. The further etch attack causes a slight further reduction of the vertical dimensions of the remaining portions of the dielectric layer 11, including the side wall spacer 10 and the small spacer 11' remaining on the step 19. The small difference between the shapes of the side wall spacer 10 is indicated in FIGS. 5 and 6. In further variants of the method the insulating layer 2 may be removed from the contact area of the connection pad 7 before the dielectric layer 11 is applied. In this case only the dielectric layer 11 has to be removed from the contact area when the side wall spacer 10 is etched. Particularly if the etching of the dielectric layer 11 can be continued through the insulating layer 2 until the connection pad 7 is exposed, the previous variant is preferred.

FIG. 7 shows a cross section according to FIG. 6 after the removal of the etch stop layer 6, which had protected the intermetal dielectric 4 against the etch attack during the formation of the side wall spacer 10 and during the removal of the insulation layer 2 from the bottom 13 of the opening 9. The intermetal dielectric 4 has therefore maintained its initial thickness in the regions above the metal planes 5.

FIG. 8 shows a cross section according to FIG. 7 after the deposition of a metal layer 12 in the opening 9. The metal layer 12 may be tungsten, for instance. Further process steps may follow to complete the interconnect, which uses the metal layer 12 as an electrical conductor through the substrate 1. If the metal layer 12 is etched back in order to remove it from the upper surface, where a top metal may be applied as an electrical connection, a remaining portion of the metal layer 12 may be left on the step 19 near the upper edge, similarly to the small spacer 11' remaining of the dielectric layer 11, owing to the relatively steep flank, which is caused by the use of the etch stop layer 6.

Although the present invention and its advantages have been described in detail, it should be understood that various changes, substitutions and alterations can be made herein without departing from the spirit and scope of the invention as defined by the appended claims.

We claim:

1. A method of producing a semiconductor device, comprising:
   providing a semiconductor substrate having a main surface and a rear surface opposite the main surface;
   providing the main surface with an intermetal dielectric and metal planes embedded in the intermetal dielectric and providing the rear surface with an insulation layer and an electrically conductive connection pad arranged in the insulation layer;
   applying an etch stop layer on the intermetal dielectric;
   forming an opening having a side wall and a bottom from the main surface through the substrate above the connection pad;
   applying a dielectric layer in the opening;

forming a side wall spacer on the side wall by partially removing the dielectric layer and removing the insulation layer from the bottom, thus uncovering an area of the connection pad, the etch stop layer preventing a removal of the intermetal dielectric above the metal planes; and applying a metal layer in the opening, thus forming an interconnect through the substrate, wherein the etch stop layer is a polyimide.

2. A method of producing a semiconductor device, comprising:

providing a semiconductor substrate having a main surface and a rear surface opposite the main surface;

providing the main surface with an intermetal dielectric and metal planes embedded in the intermetal dielectric and providing the rear surface with an insulation layer and an electrically conductive connection pad arranged in the insulation layer;

applying an etch stop layer on the intermetal dielectric;

forming an opening having a side wall and a bottom from the main surface through the substrate above the connection pad;

applying a dielectric layer in the opening;

forming a side wall spacer on the side wall by partially removing the dielectric layer and removing the insulation layer from the bottom, thus uncovering an area of the connection pad, the etch stop layer preventing a removal of the intermetal dielectric above the metal planes; and applying a metal layer in the opening, thus forming an interconnect through the substrate, wherein the etch stop layer is polysilicon.

3. A method of producing a semiconductor device, comprising:

providing a semiconductor substrate having a main surface and a rear surface opposite the main surface;

providing the main surface with an intermetal dielectric and metal planes embedded in the intermetal dielectric and providing the rear surface with an insulation layer and an electrically conductive connection pad arranged in the insulation layer;

applying an etch stop layer on the intermetal dielectric;

forming an opening having a side wall and a bottom from the main surface through the substrate above the connection pad;

applying a dielectric layer in the opening;

forming a side wall spacer on the side wall by partially removing the dielectric layer and removing the insulation layer from the bottom, thus uncovering an area of the connection pad, the etch stop layer preventing a removal of the intermetal dielectric above the metal planes; and applying a metal layer in the opening, thus forming an interconnect through the substrate, wherein the etch stop layer is removed before the metal layer is applied.

4. The method according to one of claims 1 to 3, wherein a step is formed in the intermetal dielectric when the opening is formed.

5. The method according to claim 4, further comprising:

etching the metal layer back to remove it from an upper surface, thereby leaving a remaining portion of the metal layer on the step.

6. The method according to one of claims 1 to 3, wherein a small spacer formed from the dielectric layer is left on the step.

7. The method according to one of claims 1 to 3, further comprising:

applying a mask to the upper surface of the etch stop layer before the opening is formed;

removing the intermetal dielectric in a region above the connection pad using the mask;

substituting the mask with a further mask; and removing the semiconductor material of the substrate in the region above the connection pad using the further mask.

8. The method according to claim 7, wherein a step is formed in the intermetal dielectric when the opening is formed.

9. The method according to claim 8, wherein the step is formed by the mask having a larger opening than the further mask.

10. The method according to one of claims 1 to 3, wherein the side wall spacer is formed by an anisotropic etching process applied to the dielectric layer.

11. The method according to one of claims 1 to 3, wherein the intermetal dielectric and the insulation layer are an oxide of the semiconductor material.

* * * * *